(12) United States Patent
Chen et al.

(10) Patent No.: US 9,111,873 B2
(45) Date of Patent: Aug. 18, 2015

(54) LOW PROFILE MAGNETIC FILTER

(71) Applicant: Tokyo Electron Limited, Tokyo (JP)

(72) Inventors: Lee Chen, Cedar Creek, TX (US);
Jianping Zhao, Austin, TX (US);
Merritt Funk, Austin, TX (US);
Zhiying Chen, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 14/054,902

(22) Filed: Oct. 16, 2013

(65) Prior Publication Data

US 2014/0113454 A1    Apr. 24, 2014

Related U.S. Application Data

(60) Provisional application No. 61/716,622, filed on Oct. 22, 2012.

(51) Int. Cl.
| | |
|---|---|
| *H01L 21/302* | (2006.01) |
| *H01L 21/3065* | (2006.01) |
| *H01L 21/683* | (2006.01) |
| *H01J 37/32* | (2006.01) |

(52) U.S. Cl.
CPC ......... *H01L 21/3065* (2013.01); *H01J 37/3266* (2013.01); *H01J 37/32422* (2013.01); *H01L 21/683* (2013.01)

(58) Field of Classification Search
CPC ............... H01L 21/3065; H01L 21/683; H01J 37/32651; H01J 37/32669; H01J 37/3266; H01J 37/32678; H01J 37/32633
USPC ......... 438/706, 710, 712, 714, 728, 729, 731, 438/732; 156/345.3, 345.39, 345.42
See application file for complete search history.

(56) References Cited

U.S. PATENT DOCUMENTS

| | | | |
|---|---|---|---|
| 7,716,021 B2 * | 5/2010 | Kameyama et al. | 703/2 |
| 8,114,245 B2 | 2/2012 | Ohmi et al. | |
| 2004/0163766 A1 * | 8/2004 | Kanarov et al. | 156/345.49 |
| 2004/0219737 A1 * | 11/2004 | Quon | 438/222 |
| 2006/0019477 A1 * | 1/2006 | Hanawa et al. | 438/514 |

OTHER PUBLICATIONS

Nihei, Hitoshi et al., Analyses of Plasma Flux and Density Distributrion in Plasma Sources Surrounded by Magnetic Multipole Fields, Jpn. J. Appl. Phys., vol. 34 (1995) pp. 277-284, Part 1, No. 1, Jan. 1995.

* cited by examiner

*Primary Examiner* — Lan Vinh
(74) *Attorney, Agent, or Firm* — Wood, Herron & Evans, LLP

(57) ABSTRACT

A plasma processing apparatus includes a processing chamber having a plasma processing space therein and a substrate support in the processing chamber at a first end for supporting a substrate. A plasma source is coupled into the processing space and configured to form a plasma at a second end of the processing chamber opposite said first end. The apparatus further includes a magnetic grid having an intensity of a magnetic flux therein, a plurality of passageways penetrating from a first side to a second side, a thickness, a transparency, a passageway aspect ratio, and a position within the processing chamber between the second end and the substrate. The intensity, the thickness, the transparency, the passageway aspect ratio, and the position are configured to cause electrons having energies above an acceptable maximum level to divert from the direction. A method of obtaining low average electron energy flux onto the substrate is also provided.

8 Claims, 2 Drawing Sheets

LOW PROFILE MAGNETIC FILTER

CROSS REFERENCE TO RELATED APPLICATION

Pursuant to 37 C.F.R. §1.78(a)(4), this application claims the benefit of and priority to prior filed Provisional Application Ser. No. 61/716,622, filed Oct. 22, 2012, which is expressly incorporated herein by reference.

FIELD OF THE INVENTION

The invention relates to plasma processing with microwave (MW) plasmas or surface wave plasmas (SWP). More particularly, it relates to a method and apparatus providing relatively low electron energies and plasma uniformity near a treated substrate.

BACKGROUND OF THE INVENTION

Typically, during semiconductor processing, a plasma etch process is used to remove or etch material along fine lines or within vias or contacts patterned on a semiconductor substrate. The plasma etch process generally involves positioning a semiconductor substrate with an overlying patterned, protective layer, for example a photoresist layer, into a processing chamber and etching exposed areas of the substrate through the pattern.

Once the substrate is positioned within the chamber, it is etched by introducing an ionizable, dissociative gas mixture into the chamber at a pre-specified flow rate, while adjusting a vacuum pump to achieve a processing pressure. Then, plasma is formed when a portion of the gas species is ionized by collisions with energetic electrons. The gas may be ionized by direct current, radio frequency, microwave energy, or other energy sources known to the art. The energetic electrons dissociate some of the gas species in the gas mixture to create reactant species suitable for the exposed-surface etch chemistry. Once the plasma is formed, exposed surfaces of the substrate are etched by the chemistry at a rate that varies as a function of plasma density, average electron energy, and other factors. The process is adjusted to achieve optimal conditions, including an appropriate concentration of desirable reactant and ion populations to more selectively act upon various desired features (e.g., trenches, vias, contacts, etc.) in the exposed regions of a substrate. The exposed regions of the substrate where etching is required are typically formed of materials such as silicon dioxide ($SiO_2$), poly-silicon and silicon nitride, for example.

While plasma etching has proven to be generally effective, process efficiency may be negatively impacted by a variety of factors. For example, undesirably high average electron energies tend to impede ion formation in the presence of process chemicals, and thus result in reduced dissociative attachment at the substrate. Attempts to attenuate the negative effects noted above have included the introduction of Multi Pole Magnet (MPM) assemblies and Dipole Ring Magnetron (DRM) assemblies designed to advantageously select low energy electrons near a substrate.

However, these attempts to select low electron energies by exposing plasma to magnetic fields have produced undesirable side effects. For example, in plasma processing chambers utilizing a microwave plasma (energy) source, previous magnetic assemblies yielded magnetic field profiles that bulge outwardly toward the plasma source and toward the substrate proximate the center axis of the processing chamber. This produces a strong magnetic field in the over-dense surface wave plasma ("SWP") region near the plasma source, as well as a strong magnetic field in the region of the substrate. The magnetic field lines produce complex wave propagation patterns in the SWP region, leading to plasma non-uniformity in the substrate region. Each of these side effects adversely impacts the uniformity of the semiconductor devices being processed. Apparatus and methods to reduce the bulging field in those critical regions are costly and complicated.

Therefore, an apparatus and method for uniformly applying low average electron energy plasma etch, while providing a highly controlled region of magnetic influence, is needed.

SUMMARY OF THE INVENTION

In accordance with an embodiment of the disclosed invention, a method of obtaining a low average electron energy flux onto a substrate in a processing chamber is provided. The method includes supporting a substrate to be processed at a first end of a processing chamber with a surface of the substrate facing a processing space in the processing chamber that contains a processing gas, and coupling energy into the processing space to form a plasma containing ions of the processing gas at a second end of the processing chamber opposite the substrate. The method further includes allowing electrons to propagate in a direction from the second end of the processing chamber toward the substrate at the first end of the processing chamber. A magnetic grid is provided having a plurality of passageways, a thickness, a transparency, a passageway aspect ratio, and a position within the processing chamber between the second end and the substrate. The method further includes establishing an intensity of a magnetic flux through the magnetic grid, and adjusting the intensity, the thickness, the transparency, the passageway aspect ratio, and the position to cause electrons having energies above an acceptable maximum level to divert from the direction to produce a high concentration of electrons having energies at or below the acceptable maximum level near the substrate.

In accordance with another embodiment of the invention, a plasma processing apparatus is provided. The apparatus includes a processing chamber having a plasma processing space therein and a substrate support in the processing chamber at a first end thereof for supporting a substrate thereon with a processing side thereof facing the processing space. A plasma source is coupled into the processing space so as to form a plasma at a second end of the processing chamber opposite said first end. The apparatus further includes a magnetic grid having an intensity of a magnetic flux therein, a plurality of passageways penetrating from a first side to a second side, a thickness, a transparency, a passageway aspect ratio, and a position within the processing chamber between the second end and the substrate. The intensity, the thickness, the transparency, the passageway aspect ratio, and the position are configured to cause electrons having energies above an acceptable maximum level to divert from the direction to produce a high concentration of electrons having energies at or below the acceptable maximum level near the substrate.

These and other objectives and advantages of the present invention are set forth in the following detailed description of the drawings in which:

DETAILED DESCRIPTION OF EXEMPLARY EMBODIMENTS

A plasma processing method and apparatus are disclosed in various embodiments. However, one skilled in the relevant art will recognize that the various embodiments may be practiced without one or more of the specific details, or with alternative methods, materials, or components. Well-known structures, materials, or operations are not shown or described in detail to avoid obscuring aspects of various embodiments of the invention.

Similarly, for purposes of explanation, specific numbers, materials, and configurations are set forth in order to provide a thorough understanding of the invention. Nevertheless, the invention may be practiced with alternative specific details. Furthermore, the various embodiments shown in the figures are illustrative representations and are not necessarily drawn to scale.

References throughout this specification to "one embodiment" or "an embodiment" or "certain embodiments" or variations thereof means that a particular feature, structure, material, or characteristic described in connection with the embodiment is included in at least one embodiment of the invention, but do not denote that they are present in every embodiment. Thus, the appearances of the phrases such as "in one embodiment" or "in an embodiment" or "in certain embodiments" in various places throughout this specification are not necessarily referring to the same embodiment of the invention. Furthermore, the particular features, structures, materials, or characteristics may be combined in any suitable manner in one or more embodiments.

Nonetheless, it should be appreciated that, contained within the description are features which, notwithstanding the inventive nature of the general concepts being explained, are also of an inventive nature.

Figure 1:
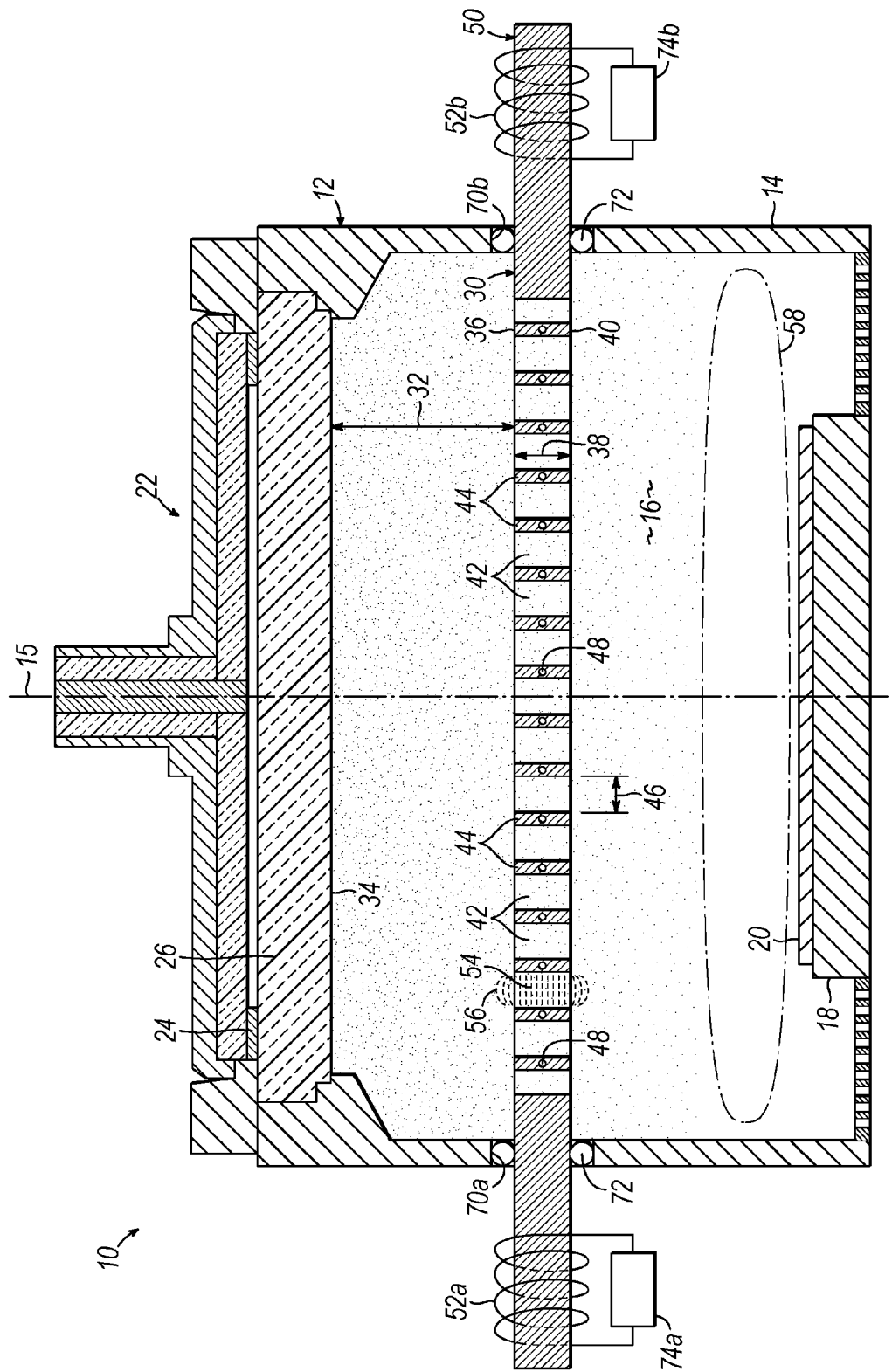
FIG. 1 is a cross sectional view of one embodiment of the disclosed processing system.

Referring now to the drawings, wherein like reference numerals designate identical or corresponding parts throughout the several embodiments or several views, FIG. 1 illustrates a plasma processing system 10 according to certain embodiments of the invention. The plasma processing system 10 may be, for example, a dry plasma etching system or a plasma enhanced deposition system.

One embodiment of the plasma processing system 10 includes a processing chamber 12 having a chamber wall 14 configured to enclose a process space 16. The chamber wall 14 is typically a cylinder having a central axis 15. The processing chamber 12 has therein a substrate support 18 configured to support a substrate 20 in the process space 16. Furthermore, the plasma processing chamber 12 has a plasma source 22 coupled to the processing chamber 12 and configured to energize a plasma in the process space 16. During operation of the system 10, the substrate 20 is exposed to plasma electrons, or process chemistry, or both, in process space 16. The plasma source 22 may be energized by direct current, radio frequency, microwave energy, or other plasma sources known to the art. A quartz window 26 may be included to form a sealed interface between the plasma source 22 and the process pace 16. The plasma source 22 and the substrate support 18 are coaxially aligned on the central axis 15.

Figure 2:
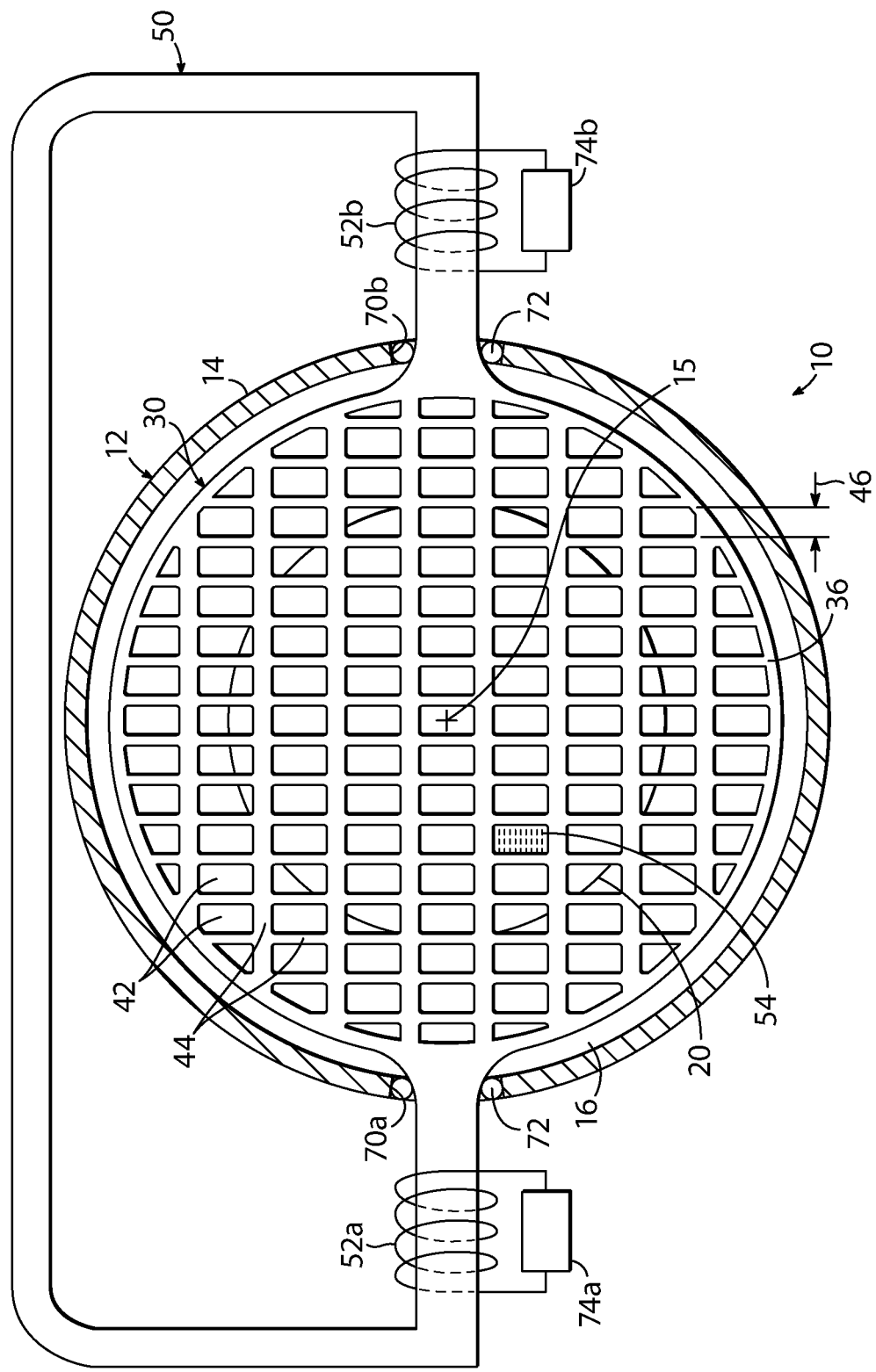
FIG. 2 is a top view of the processing chamber and magnetic grid configuration.

As seen in FIG. 1 and as further illustrated in FIG. 2, the plasma processing system 10 includes a magnetic grid 30 disposed within the process space 16 between the substrate support 18 and plasma source 22. The magnetic grid 30 is located at a position 32 defined as the distance from the interior face 34 of the quartz window 26 to the top face 36 of the magnetic grid 30. The magnetic grid 30 has a thickness 38 defined as the distance from the top face 36 to the bottom face 40 of the magnetic grid 30, and includes a plurality of passageways 42 and solid regions 44. Each passageway 42 has a passageway width 46 (which will be explained in further detail below to be the shortest distance across the passageway 42). In some embodiments of the invention, all passageways 42 have the same passageway width 46, while other embodiments include passageways 42 having varied passageway widths 46 at different regions of the magnetic grid 30. The passageways 42 of the magnetic grid 30 have an aspect ratio defined as the thickness 38 divided by the passageway width 46.

The magnetic grid 30 may be fabricated from a ferromagnetic material. In some embodiments, the magnetic grid 30 may be comprised of iron having a purity exceeding 99%. Some embodiments of the magnetic grid 30 may use soft annealed iron, while other may use single or poly crystal forms. In the high-purity iron embodiments of the magnetic grid 30, magnetic flux is generated and propagated via additional structures that will be explained in detail below. In the alternative, the magnetic grid 30 may be inherently magnetized by fabricating the magnetic grid 30 of a permanent magnetic material. For example, neodymium or samarium-cobalt compounds may be used for this purpose. The intensity of magnetic flux within the magnetic grid 30 may be varied by adjusting the composition or concentration of permanent or rare earth magnetic material in the magnetic grid 30.

In any of the previous embodiments, the magnetic grid 30 may be coated in yttrium oxide to provide a layer that is substantially resistant to the etching chemicals that may be encountered in the process space 16. Alternatives to yttrium oxide may include alumina, zirconia, quartz, etc. Additionally, the magnetic grid 30 may include a plurality of conduits 48 configured to convey a temperature regulating fluid. Particularly in the case of magnetic grids 30 fabricated from permanent magnetic material, magnetic field strength may be degraded by heat. Therefore, a temperature regulating fluid may be pumped through the conduits 48 to cool the actual temperature of the magnetic grid 30 within an acceptable deviation from a target temperature. In other embodiments, the temperature regulating fluid may be used to heat the actual temperature of the magnetic grid 30 to an acceptable deviation from a target temperature.

Some embodiments of the invention include a ferromagnetic yoke 50 coupled to the magnetic grid 30. The yoke 50 may pass through the chamber walls 14 of the processing chamber 12, and the points of penetration may be occluded with seals 72. The seals 72 may comprise o-rings, gaskets, sealing compounds, or the like to maintain the vacuum integrity of the processing chamber 12. In some embodiments, the yoke 50 is coupled to the magnetic grid 30 at two diametrically opposed locations so as to establish a continuous circuit for the propagation of magnetic flux.

One or more electromagnetic coils 52a and 52b may be wrapped around the yoke 50. The electromagnetic coils 52a and 52b are coupled to a power supply (not shown), and serve as a source of magnetic flux. If a plurality of electromagnetic coils 52a and 52b are used, it may be desirable to wrap the winding of the coil in the same clockwise or counterclockwise direction, such that the lines of flux are propagated through the yoke 50 and through the magnetic grid 30 in the same linear direction (in accordance with the right hand rule). In FIG. 1, the electromagnetic coils 52a and 52b are configured to pass the lines of flux from the right side of the magnetic grid 30 to the left side of the magnetic grid 30.

FIG. 1 further illustrates both constrained flux lines 54 and fringe flux lines 56 (shown as dotted lines). Both serve to advantageously select low energy electrons that pass through the passageways 42 and through the constrained flux lines 54 and fringe flux lines 56 (as will be explained in greater detail below), but it is also important to note that the fringe flux lines 56 only stray from the top face 36 and bottom face 40 of the magnetic grid 30 a very short distance. In some embodiments of the invention, testing has indicated that the fringe flux lines 56 are substantially attenuated at distances greater than approximately 3 cm from the top face 36 and bottom face 40 of the magnetic grid 30. Therefore, the bulk of the magnetic flux is constrained within the plane of the magnetic grid 30 and fringe flux lines 56 have virtually no impact on regions of the process space 16 near the substrate 20 or the plasma source 22.

In use, a plasma originates near the quartz window 26 and propagates toward the substrate 20 in the process space 16. The plasma is exothermic near the quartz window 26, but the temperature decreases as a function of distance away from the quartz window 26. In some embodiments, the magnetic grid 30 may be positioned and dimensioned to allow the resulting magnetic field lines to act perpendicularly upon some portion of the plasma in the process space 16. In one embodiment, the position 32 is selected to coincide with a region of the process space 16 wherein the plasma is no longer exothermic. The thickness 38 of the magnetic grid 30 may be dimensioned so that it is great enough to achieve electron cooling and low energy selection, and small enough to minimize plasma density loss. Depending on processing variables, some embodiments of the invention may use a magnetic grid 30 with a thickness 38 between approximately 0.5 cm to approximately 10 cm. In one embodiment of the invention, the magnetic grid 30 is approximately 1 cm in thickness.

For a given thickness 38 of magnetic grid 30, the aspect ratio (as defined above) is selected such that the combination of thickness 38 and passageway width 46 is sufficient to have a desired impact on propagating electrons. Electron selection or filtering is accomplished by taking advantage of the varied radius of gyration among electrons in the process space 16. Since the radius of gyration of a particle is a function of its energy, an electron with low energy will gyrate relatively little in the presence of a magnetic field.

Therefore, a low energy electron can pass through a small passageway width 46 without contacting the magnetic grid 30 (such contact discharges the electron to ground potential), but a higher energy electron has a reduced probability of passing through the same width. It should be noted that while the passageways 42 may be constructed of various cross-sectional geometries (e.g., rectangular (depicted in FIG. 2), square, hexagonal, circular, etc.) the shortest distance across the passageway 42 defines the passageway width 46. For example, a passageway 42 having a rectangular cross-section and dimensions of 1×3 cm, would yield a passageway width 46 of 1 cm.

Similarly, the selected thickness 38 determines how many times a particle will gyrate as it passes through the passageway 42 and constrained flux lines 54 and fringe flux lines 56. Generally, a low energy electron has a better chance of avoiding contact with the magnetic grid 30 after prolonged gyration, due to its smaller radius of gyration. Conversely, a highly energetic electron will gyrate a smaller number of times as it passes through the magnetic grid 30, because of its larger gyration radius, and thus a correspondingly greater chance of contacting the magnetic grid 30.

To further facilitate appropriate plasma passage through the magnetic grid 30, the ratio of passageways 42 to solid regions 44 (also referred to as transparency), may be approximately 70%. As will be appreciated by one of ordinary skill in the art, depending on process objectives, greater or lesser transparency values may produce acceptable results. By way of example, and not limitation, the transparency may be greater than 1% and/or may be lower than 99%. By way of further example, the transparency may be 65-75%.

In use, in one embodiment of the disclosed invention, the plasma source 22 is energized to generate a plasma within the process space 16. The plasma forms at the end of the chamber adjacent the quartz window 26 and propagates toward the substrate support 18 into the process space 16. The Radial Line Slot Antenna 24, coupled to a microwave source, may be used to form the surface wave plasma. In the plasma, if left unchecked, a majority of the produced electrons are excessively energetic. This results in unacceptably low electron concentrations in the region near the substrate 20, and it can result in poor performance of the plasma etch upon the substrate 20. However, by introducing the magnetic grid 30, the magnetic field passing across the passageways 42 advantageously influences and filters the distribution of electron energy levels near the substrate 20.

As high energy electrons travel from the top of the process space 16 to the substrate 20, the most energetic electrons are highly influenced by the magnetic field and are deflected away from the substrate 20 (and into solid regions 44) with a force perpendicular to their direction of travel. Conversely, lower energy electrons are less significantly impacted by the magnetic field forces (they have a smaller radius of gyration), and are therefore permitted to pass through the passageways 42 of the magnetic grid 30. The electrons may then propagate further downward into the chamber toward the substrate 20. The presence of the magnetic field results in a filtering effect, wherein the less desirable high energy electron concentrations reside at the top of the process space 16, or are directed into the solid regions 44 where they are sent to ground potential. Conversely, lower energy electrons propagate through the passageways 42 into a quiescent region 58 near the substrate 20, where their reduced energy facilitates negative ion production (in the presence of a process chemical) and effective etch performance.

FIG. 2 is a top view of the plasma processing system 10. The magnetic grid 30 is disposed within the process space 16 and is coaxial with the central axis 15. The yoke 50 is coupled to the magnetic grid 30 and passes through the chamber wall 14 at openings 70a and 70b. The interface between the yoke 50 and openings 70a and 70b may be filled with a seal 72 so as to maintain the gas-tight or vacuum-tight integrity of the process space 16. One or more electromagnetic coils 52a and 52b are wrapped around the yoke 50. In one embodiment of the disclosed invention, the electromagnetic coils 52a and 52b are wrapped in the same clockwise or counter-clockwise direction, so as to move flux across the magnetic grid 30 in accordance with the right-hand rule. As configured in FIG. 2, the electromagnetic coils 52a and 52b are wrapped in a direction that produce flux traveling from the right-hand side of the magnetic grid 30 to the left-hand side of the magnetic grid 30. Also, as configured in FIG. 2, the yoke 50 that is mated to the magnetic grid 30 serves as a conduit for magnetic flux. The flux circulates in a generally clockwise direction through the magnetic grid 30 and is recycled through the yoke 50.

The intensity of the magnetic field passing through the magnetic grid 30 may be adjusted by manipulating the power applied to the electromagnetic coils 52a and 52b using one or more adjustable power supplies 74a and 74b. In use, once energized plasma is established in the processing space 16, electrons propagate from the plasma source 22 (shown in FIG. 1), toward the top face 36 of the magnetic grid 30. The magnetic grid 30 in this particular embodiment is configured with a transparency of approximately 70%. That is, the ratio of passageways 42 to solid regions 44 is approximately 70%. Highly energetic electrons, which are undesirable in the quiescent region 58 (shown in FIG. 1) near the substrate 20, gyrate significantly in the presence of the constrained flux lines 54 and fringe flux lines 56 covering the passageways 42. This gyration causes many of the high energy electrons to strike the solid region 44 of the magnetic grid 30. These energetic electrons, upon contact with the solid region 44, are brought to zero potential. Conversely, low energy electrons, which are desirable in the quiescent region 58 (shown in FIG. 1) near the substrate 20, pass through the passageways 42. Since the low energy electrons gyrate very little in the presence of the electromagnetic flux, there is a reduced likelihood of coming into contact with the solid region 44 of the magnetic grid 30. Therefore, the magnetic grid 30 serves as a filter to exclude highly energetic electrons from propagating through the passageways 42, while allowing a large portion of low energy electrons to propagate through the passageways 42.

As mentioned above, the aspect ratio, or ratio of thickness 38 (shown in FIG. 1) divided by passageway width 46, is a useful parameter to adjust the filtering performance of the magnetic grid 30. By way of example, and not limitation, the aspect ratio may be selected to maintain between 70-90% of the plasma density in the region of the process space 16 between the magnetic grid 30 and the substrate 20, as compared to the region of the process space between the magnetic grid 30 and the quartz window 26. The aspect ratio may also be chosen so that the magnetic grid 30 is effective to prevent passage of the most energetic 20% of electrons, while allowing the passage of the less energetic 80% of electrons.

In accordance with an embodiment of the disclosed invention, a method of obtaining a low average electron energy flux onto a substrate 20 in a processing chamber 12 is provided. The method includes supporting a substrate 20 to be processed at a first end of a processing chamber 12 with a surface of the substrate 20 facing a process space 16 in the processing chamber 12 that contains a processing gas. The method also includes coupling energy into the process space 16 to form a plasma containing ions of the processing gas at a second end of the processing chamber 12 opposite the substrate 20. The method further includes allowing electrons to propagate in a direction from the second end of the processing chamber 12 toward the substrate 20 at the first end of the processing chamber 12. The method also includes providing a magnetic grid 30 having a plurality of passageways 42, a thickness 38, a transparency, a passageway aspect ratio, and a position 32 within the processing chamber 12 between the second end and the substrate 20. The method further includes establishing an intensity of a magnetic flux through the magnetic grid 30, and adjusting the intensity, the thickness 38, the transparency, the passageway aspect ratio, and the position 32 to cause electrons having energies above an acceptable maximum level to divert from the direction to produce a high concentration of electrons having energies at or below the acceptable maximum level near the substrate 20.

It will be further recognized that in order to achieve a higher level of process results uniformity, a zoned magnetic grid may be employed. In such a grid, multiple pairs of power supplies may be used to energize multiple grids, each independently driven by a separate pair of power supplies. Zoned grids may, for example, be configured in a bulls-eye pattern, with one zone in the center and one or more additional annular zones, wherein each zone is excited by a separate electromagnet or electromagnet pair. These multiple zoned grids may be stacked one above each other (in the side view of FIG. 1), or they may be nested such that an inner circular zone is nested in the same plane within an outer annular zone. In the latter case, the yokes 50 of each zone may extend off of the plane of each zone grid, so as to allow independent excitation by separate electromagnets. A further alternative to prevent crowding of electromagnets is to clock the electromagnets in increments of, for example, 30, 45, 60, 90, etc. degrees around the circumference of the chamber.

One of ordinary skill in the art will recognize that the acceptable maximum level will be selected in view of semiconductor processing objectives, the processing chemicals used in a particular processing step, or quality control and device yield targets. By way of example, and not limitation, the acceptable maximum level may be selected to produce a 5% increase in usable semiconductors (yield) over systems that do not use the disclosed invention. Likewise, the maximum acceptable level may be selected to increase etching efficiency (determined by a reduction in processing time, reduction in process gas consumption, etc.) by 10% over prior art systems. The maximum acceptable level may also be selected to produce a 15% increase in etch uniformity among various positions on a substrate.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

What is claimed is:

1. A method of obtaining a low average electron energy flux onto a substrate in a processing chamber, comprising:
   supporting a substrate to be processed at a first end of a processing chamber with a surface of the substrate facing a processing space in the processing chamber that contains a processing gas;
   coupling energy into the processing space by a surface wave plasma (SWP) source that includes a radial line slot antenna (RLSA) disposed near a second end of the processing chamber opposite the substrate to form a surface wave plasma containing ions of the processing gas at the second end of the processing chamber;
   allowing electrons to propagate in a direction from the second end of the processing chamber toward the substrate at the first end of the processing chamber;
   providing a magnetic grid having a plurality of passageways, a thickness, a transparency, a passageway aspect ratio, and a position within the processing chamber between the second end and the substrate;
   establishing an intensity of a magnetic flux through the magnetic grid; and
   adjusting the intensity, the thickness, the transparency, the passageway aspect ratio, and the position to cause the electrons that are a top 20% most energetic of the electrons to divert from the direction to produce a concentration of electrons that are an 80% less energetic of the electrons near the substrate.

2. The method of claim 1, wherein the position originates at a distance spaced from said second end wherein the plasma is no longer exothermic.

3. The method of claim 1, wherein the passageway aspect ratio is sufficiently large to allow passage of the portion of the less energetic electrons to the substrate, yet is sufficiently small to maintain 70% to 90% of plasma density in a region of the process space between the magnetic grid and the substrate as compared to a region of the process space between the magnetic grid and the second end of the processing chamber.

4. The method of claim 1, wherein the transparency value is about 70%.

5. The method of claim 1, wherein establishing an intensity of a magnetic field comprises introducing magnetic flux from an electromagnetic source external to the processing chamber.

6. The method of claim 1, wherein establishing an intensity of a magnetic field comprises adjusting a percentage or a composition of a rare-earth permanent magnetic material within the magnetic grid.

7. The method of claim 1, wherein the thickness is between approximately 0.25 cm and between approximately 10 cm.

8. The method of claim 7 wherein the thickness is approximately 1 cm.

\* \* \* \* \*